(12) United States Patent  
Lizio

(10) Patent No.: US 9,018,048 B2
(45) Date of Patent: Apr. 28, 2015

(54) PROCESS FOR MANUFACTUIRNG SUPER-BARRIER RECTIFIERS

(71) Applicant: STMicroelectronics S.r.l., Agrate Brianza (IT)

(72) Inventor: Francesco Lizio, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 63 days.

(21) Appl. No.: 14/032,123

(22) Filed: Sep. 19, 2013

(65) Prior Publication Data

US 2014/0087539 A1 Mar. 27, 2014

(30) Foreign Application Priority Data

Sep. 27, 2012 (IT) .............................. TO2012A0844

(51) Int. Cl.
| | |
|---|---|
| *H01L 21/332* | (2006.01) |
| *H01L 29/66* | (2006.01) |
| *H01L 21/266* | (2006.01) |
| *H01L 29/861* | (2006.01) |
| *H01L 21/265* | (2006.01) |
| *H01L 29/417* | (2006.01) |
| *H01L 29/78* | (2006.01) |
| *H01L 29/08* | (2006.01) |

(52) U.S. Cl.
CPC ........ *H01L 29/66492* (2013.01); *H01L 21/266* (2013.01); *H01L 29/6609* (2013.01); *H01L 29/861* (2013.01); *H01L 21/26586* (2013.01); *H01L 29/41766* (2013.01); *H01L 29/7802* (2013.01); *H01L 29/0878* (2013.01)

(58) Field of Classification Search
USPC ........... 438/134, 529, 551, 552; 257/E21.358
See application file for complete search history.

(56) References Cited

U.S. PATENT DOCUMENTS

| | | | |
|---|---|---|---|
| 5,661,326 A | 8/1997 | Hong | |
| 6,221,688 B1 * | 4/2001 | Fujihira et al. | 438/92 |
| 6,331,455 B1 * | 12/2001 | Rodov et al. | 438/138 |
| 6,420,225 B1 | 7/2002 | Chang et al. | |
| 6,448,160 B1 | 9/2002 | Chang et al. | |
| 6,604,230 B1 | 8/2003 | Khalid et al. | |
| 6,765,264 B1 | 7/2004 | Chang et al. | |
| 6,992,353 B1 | 1/2006 | Wu | |
| 7,786,015 B2 | 8/2010 | Chen et al. | |
| 8,148,748 B2 | 4/2012 | Ankoudinov et al. | |

(Continued)

FOREIGN PATENT DOCUMENTS

| | | |
|---|---|---|
| EP | 1420457 A1 | 5/2004 |
| EP | 2 061 084 A1 | 5/2009 |

(Continued)

*Primary Examiner* — Chandra Chaudhari
(74) *Attorney, Agent, or Firm* — Seed IP Law Group PLLC

(57) ABSTRACT

A process for manufacturing a semiconductor device, wherein a semiconductor layer is formed on a body of semiconductor material; a first mask is formed on the semiconductor layer; a first conductive region is implanted in the body using the first mask; a second mask is formed laterally and complementarily to the first mask, at least in a projection in a plane parallel to the surface of the body; a second conductive region is implanted in the body using the second mask, in an adjacent and complementary position to the first conductive region; spacers are formed on the sides of the second mask region, to form a third mask aligned to the second mask; and, using the third mask, portions of the semiconductor layer are removed to form a gate region.

18 Claims, 11 Drawing Sheets

(56) References Cited

U.S. PATENT DOCUMENTS

| | | |
|---|---|---|
| 8,421,118 B2 | 4/2013 | Ankoudinov et al. |
| 2002/0076860 A1 | 6/2002 | Akiyama et al. |
| 2003/0222290 A1 | 12/2003 | Rodov et al. |
| 2006/0131646 A1 | 6/2006 | Wu |
| 2009/0267111 A1 | 10/2009 | Ankoudinov et al. |
| 2010/0271851 A1 | 10/2010 | Ankoudinov et al. |
| 2011/0051305 A1 | 3/2011 | Ankoudinov et al. |
| 2012/0211798 A1 | 8/2012 | Ankoudinov et al. |

FOREIGN PATENT DOCUMENTS

| | | |
|---|---|---|
| WO | 2009/042807 A2 | 4/2009 |
| WO | 2009/134812 A1 | 11/2009 |
| WO | 2010/030400 A1 | 3/2010 |

\* cited by examiner

PROCESS FOR MANUFACTUIRNG SUPER-BARRIER RECTIFIERS

BACKGROUND

1. Technical Field

The present disclosure relates to a process for manufacturing semiconductor devices, such as super-barrier rectifiers.

2. Description of the Related Art

As is known, the recent family of super-barrier rectifiers (SBRs), namely, adjustable field-effect rectifiers (AFERs, see for example U.S. Pat. No. 8,148,748) envisages the use of regions typical of MOSFET transistors and the addition of a so-called "pocket" or "probe" region so as to reduce the negative resistance and at the same time have a high recovery speed, even at high frequency, and in this way reduce the problems of electromagnetic interference.

With this device, it is important for the distance between the channel and the "pocket" or "probe" to be as small as possible, but for the two regions not to overlap. Consequently, the channel implant has lateral dimensions and corresponding tolerances that are very critical.

Since in this technology the channel is lithographically defined, the performances of the device are limited by the very accuracy of the lithographic process.

By virtue of the probe implantation being made subsequently and in regions complementary to the channel regions, alignment errors occurring in the various masking levels add together, jeopardizing the final result or, at the very least, reducing the performances of the finished device.

On the other hand, the current trend to miniaturization uses, at least in certain applications, an increase in the circuit density so that it becomes important to reduce both the spacing and the overlap between the adjacent regions.

For a better understanding of the problem referred to above, reference may be made to FIGS. 1-10, which show an adjustable field-effect rectifiers (AFER) diode developed by the present applicant.

FIG. 1 shows a cell 2 belonging to an AFER diode 1, generally comprising a plurality of cells 2, adjacent to each other and formed by strip-like shaped regions extending perpendicularly to the drawing plane. The AFER diode 1 is formed in a substrate 3 of semiconductor material of an N– type, which forms a first drain region. A second drain region of an N+ type (not shown) may extend underneath the substrate 3, and a drain metallization (not shown either) may extend underneath the second drain region.

Each cell 2 comprises a well region 4, of a P type; source regions 16, of an N+ type; and a probe region 5, of an N type, facing a surface 6 of the substrate 3.

A gate oxide layer 11 extends over the surface 6, and a gate region 12 extends over the gate oxide layer 11. The gate oxide layer 11 and the gate region 12 have, in each cell 2, an opening 13, and a portion 14a of a conductive (metal) region 14 arranged on top of the gate region 12 extends in the opening 13. The portion 14a of the metal region 14 extends also partially within the substrate 3 and is here adjacent to the source regions 16 and to the well region 4.

In detail, the source regions 16 extend on the two sides of, and directly adjacent to, the portion 14a of the metal region 14. The well region 4 comprises a deep portion 9, which is more doped, extending underneath the portion 14a of the metal region 14, and two surface portions (forming channel regions 10), which face the surface 6 and are each arranged on a side of a respective source region 16. The channel regions 10 are each adjacent to a respective probe region 5 (one belonging to the cell 2 itself, the other to the adjacent cell 2). The probe region 5 is deeper than the channel regions 10, but is arranged closer to the surface than the deep portion 9 of the well region 4.

In practice, the portion 14a of the metal region 14 directly contacts and electrically connects together the gate region 12, the source regions 16, and the deep portion 9 of the well region 4. A silicide layer 15, for example of titanium, may extend underneath the metal region 14, over the gate region 12 and on the sides of the opening 13.

The AFER diode 1 is obtained as shown in FIGS. 2-9.

Initially (FIG. 2), the active area is prepared: the gate oxide layer 11 and the gate region 12, here of polysilicon, are formed on the substrate 3.

Then (FIG. 3), a poly mask 20, of resist, is formed on the gate region 12 and has a window 21 where the opening 13 is to be formed. Using the poly mask 20, the exposed portion of the gate region 12 is removed to obtain the window 13, and, in the substrate 3, an implantation of dopant species of a P type, for example a boron implantation, is carried out so as to form a p-well region 17.

Next (FIG. 4), using the same poly mask 20, a tilted implantation is carried out with dopant species of an N++ type, for example arsenic, so as to form an enriched layer 22, which, thanks to the tilted implantation, extends, with its peripheral portions, underneath the gate region 12.

Then (FIG. 5), the gate oxide layer 11 and the substrate 3 are etched and removed in the area underneath the window 21 (and thus the opening 13) to form a microtrench 18. In this way, also part of the enriched layer 22 is removed, but underneath the gate region 12, the peripheral portions of the enriched layer 22 remain, to form the source regions 16.

Next (FIG. 6, an implantation of dopant species of a P type (e.g., $BF_2$) is carried out inside the p-well region 17, to form a thin layer 23 of a P type, more doped than the p-well region 17 and not shown for simplicity in the subsequent figures.

After removal of the poly mask 20 (FIG. 7), a channel mask 24 of resist is formed. The channel mask 24 has a window 25 that is ideally centered with respect to the window 21 of the poly mask 20 (and thus to the opening 13), but is wider, so as to expose, in addition to the microtrench 18 and the opening 13, also the top surface of the two portions of the gate region 12, laterally to the opening 13. Then, dopant species of a P type are implanted to provide the channel regions 10 in the substrate 3, laterally to the opening 13, and an enriched area 26 within the p-well region 17. However, since the channel implant has a lower dose than the well implant (typically the difference is of two orders of magnitude, $10^{12}$ for the channel implant and $10^{14}$ for the well implant), the channel implant does not modify the concentration of the p-well region 17. Consequently, the enriched area 26 is no longer shown in the subsequent figures. Ideally, the width of the channel regions 10 should be the same; however, on account of the inevitable misalignments between the poly mask 20 and the channel mask 24, in practice they have a different length.

After removing the channel mask 24, a probe mask 27 is formed (FIG. 8). Probe mask 27 is ideally complementary to the channel mask 24 and covers the gate region 12 on top of the p-well region 17 and the channel regions 10. Dopant species of an N type are then implanted to form the probe regions 5 laterally to each channel region 10. Ideally, the probe regions 5 are immediately adjacent to the channel regions 10, even though they may extend to a greater depth, but the misalignment between the channel mask 24 and the probe mask 27 may cause a spacing between one channel region 10 and the adjacent probe region 5, on one side, and an overlapping between the two regions 10, 5, on the opposite side.

After removing the probe mask 27, the silicide layer 15 (FIG. 9) and then the metal region 14 (FIG. 10) are formed.

After the thermal steps for activating the dopant species, the structure of FIG. 1 is obtained, wherein the deep portion 9 of the well region 4 has a non-uniform doping, and the well region 4 embeds the channel regions 10.

In AFER diodes of this type, the lateral dimensions are very small and critical so that alignment errors referred to above may considerably affect the operation of the diode and may use compromises for relaxing design rules and tolerances.

For example, in devices produced by the present applicant, the probe region 5 and the opening 13 may have a width of approximately 350 nm, and the distance between the opening 13 and the adjacent side edge of the probe region 5 may be approximately 250 nm, so as to ensure a channel length of approximately 100 nm, with a lateral dimension of the source region 16 of approximately 150 nm. The length of channel (width of the channel region 10, between the source region 16 and the probe region 5) may be 100 nm.

As indicated above, with the described manufacturing technique, criticality derives from the fact that the channel implant (using the channel mask 24) and the probe implant (using the probe mask 27) are aligned, with two different photo-techniques, to the contact previously opened in the gate region 12 (opening 13 obtained using poly mask 20), on the basis of the precision degree used for the channel and probe photo-techniques.

To achieve this precision, various solutions have been suggested, such as: use of exposure systems for VLSI technologies, with maximum misalignments within 20 nm; execution of dimensional checks in all the steps; use of feedback systems for automatic compensation of the process drift; and use of golden tools.

However, these actions have an impact on the production flow in terms of costs and cycle times.

BRIEF SUMMARY

According to the present disclosure, a process for manufacturing semiconductor devices is provided.

In practice, a fully self-aligned structure is provided, which can be formed with less accurate photo-techniques.

In fact, the three photo-techniques (corresponding to the poly mask 20, the channel mask 24, and the probe mask 27), are replaced by a single photo-technique, namely, the probe one. The subsequent processes enable opening of complementary and self-aligned regions for the channel implant and opening of the self-aligned contact on polysilicon.

One embodiment of the present disclosure is directed to a process for manufacturing a semiconductor device that includes forming a semiconductor layer on a surface of a semiconductor body, forming a first mask on the semiconductor layer, forming a first conductive region in the body by introducing a first dopant species into the body using the first mask, forming a second mask laterally and complementarily to the first mask, at least in a projection in a plane parallel to the surface of the body, forming a second conductive region in the body by introducing a second dopant species into the body using the second mask, in an adjacent and complementary position to the first conductive region, forming a third mask aligned to the second mask by forming spacers on sides of the second mask, and forming a gate region by removing portions of the semiconductor layer using the third mask.

BRIEF DESCRIPTION OF THE SEVERAL VIEWS OF THE DRAWINGS

For a better understanding of the present disclosure preferred embodiments thereof are now described, purely by way of non-limiting example, with reference to the attached drawings, wherein.

DETAILED DESCRIPTION

Figure 1:
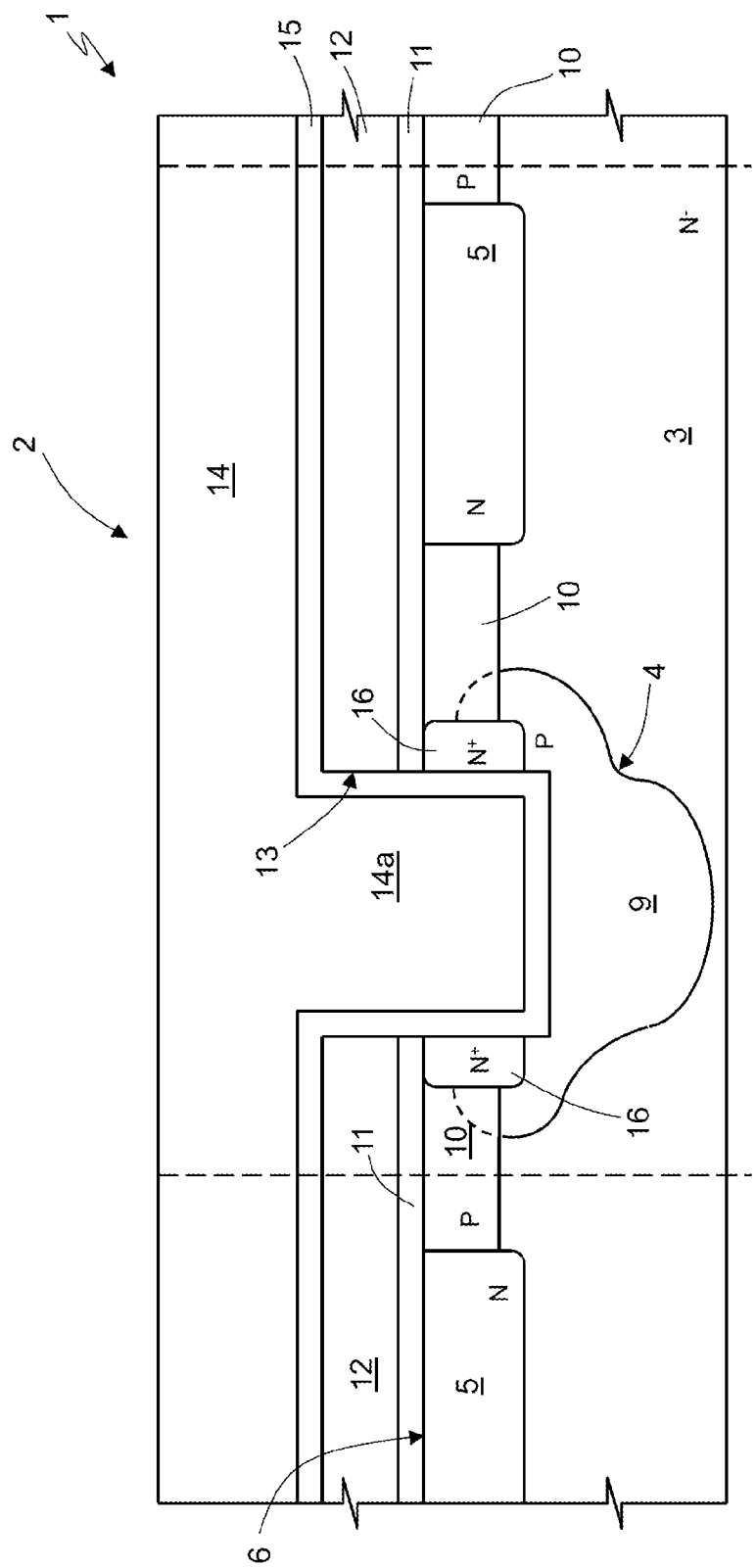
FIG. 1 shows, in cross-section, an adjustable field-effect rectifiers (AFER) diode made by the present applicant.
Figure 2:
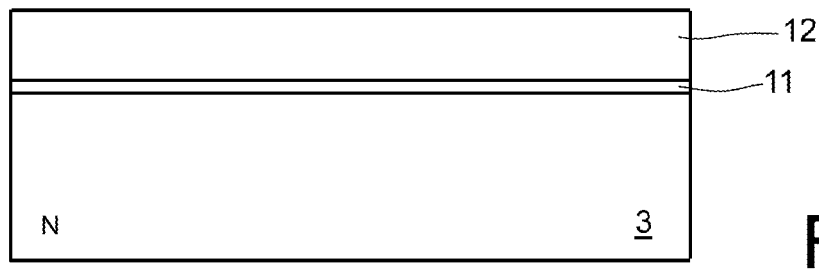
FIGS. 2-10 show cross-sections of the AFER diode of FIG. 1, in successive manufacturing steps.
Figure 3:
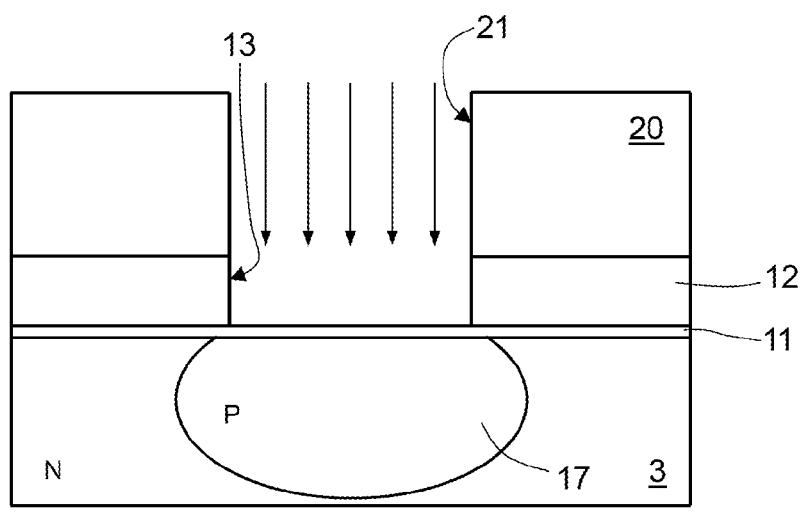
Figure 4:
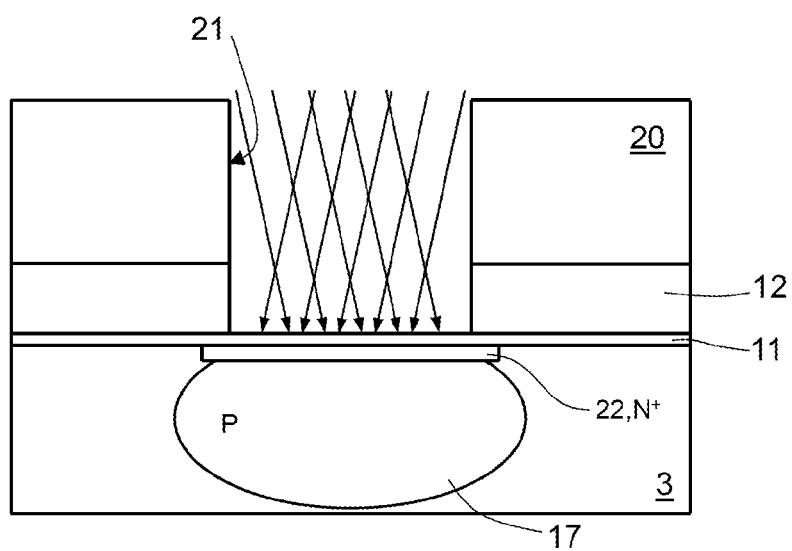
Figure 5:
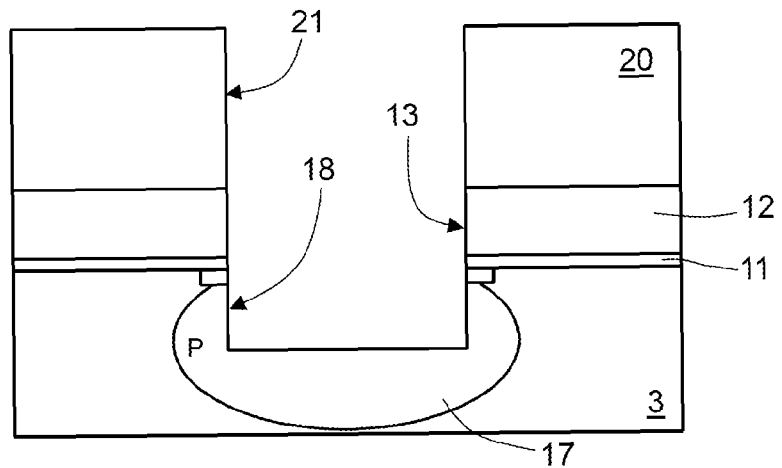
Figure 6:
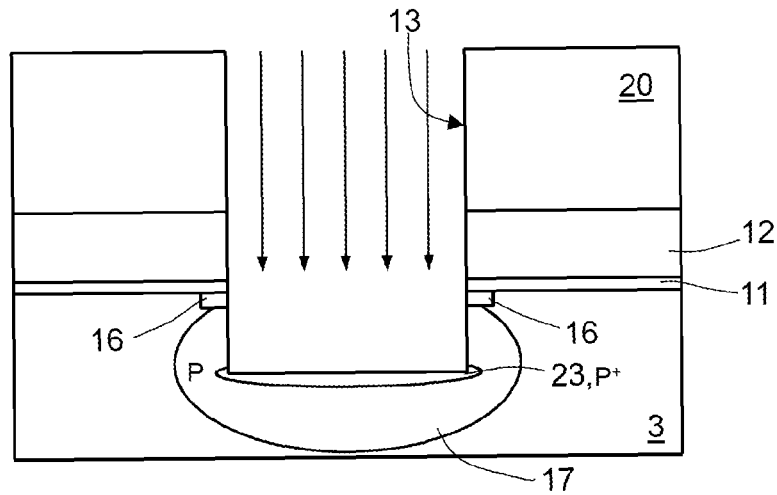
Figure 7:
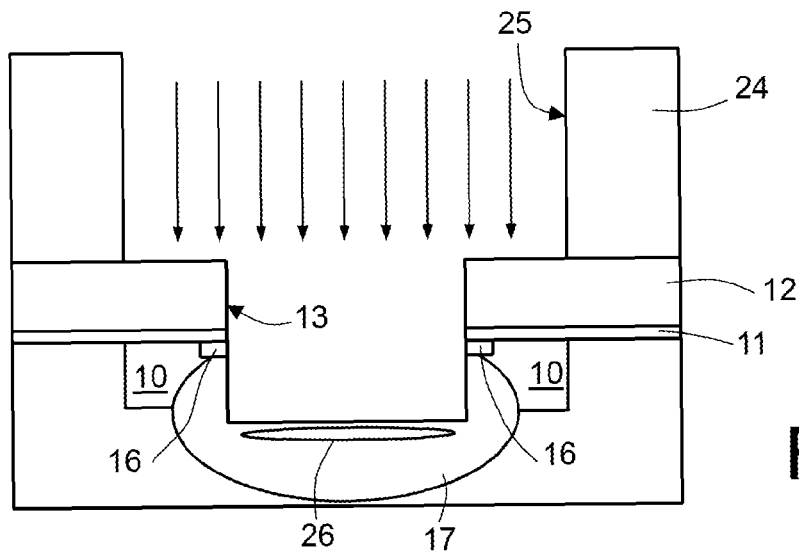
Figure 8:
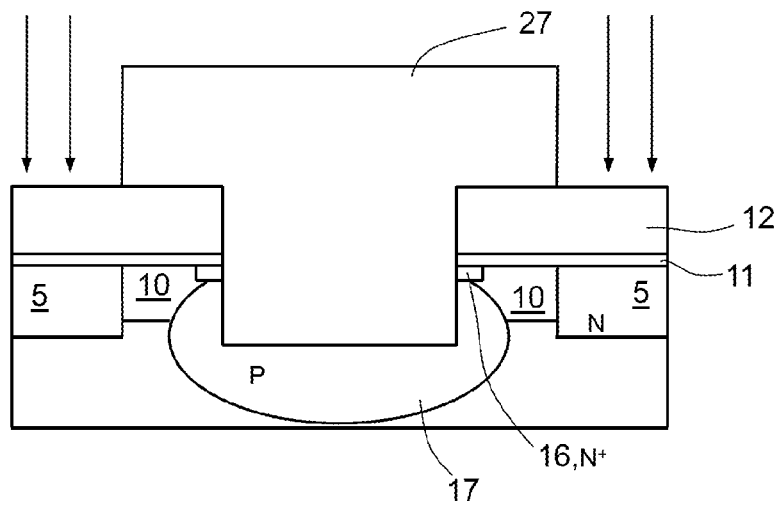
Figure 9:
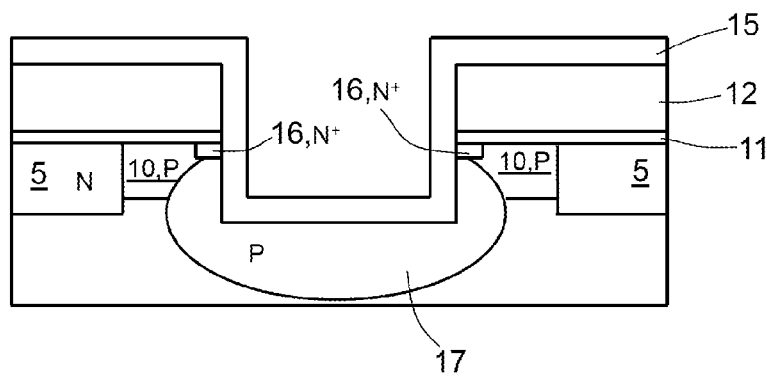
Figure 10:
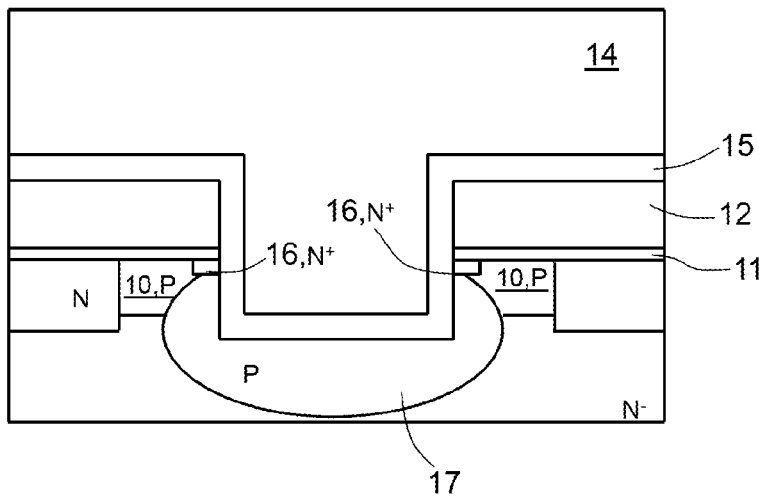

The present process for manufacturing an AFER diode is based upon: forming a first mask on a gate layer; implanting a probe region in the substrate using the first mask; forming a second mask laterally and complementary to the first mask, at least in a projection in a plane parallel to the surface of the body; implanting a channel region, in a complementary position to the probe region, using the second mask; forming spacers on the sides of the second mask; and removing portions of the semiconductor layer to obtain a gate region.

In particular, the first mask has a first window that is filled with filling material to form a complementary mask; after providing the complementary mask, the first mask is removed and the second mask is formed so as to comprise the complementary mask or be arranged thereon, congruent therewith.

FIGS. 11-21 show an embodiment of the present process.

First, initial steps are carried out for forming edge regions (not shown), in a per se known manner. Then (FIG. 11), the active area is prepared: on a substrate 30, also here of an N type, a gate oxide layer 31, a gate layer 32, and an insulating layer 33, e.g., an oxide layer, such as a TEOS (tetraethyl orthosilicate) layer, are formed.

Then (FIG. 12), a resist probe mask 34 is formed, which has windows 35 where the probe regions are to be formed. Then, a probe implantation is carried out, here of dopant species of an N type, for example arsenic. The implantation is performed according to parameters, in particular energy, studied so as to enable the dopant ion species to traverse the insulating layer 33, the gate layer 32, and the gate oxide layer 31, and causes probe regions 37 to be formed (FIG. 13).

Next (FIG. 13), the windows 35 of the probe mask 34 are filled with a filling material (filler regions 39) of material compatible with, and having a high selectivity with respect to, the photoresist of the probe mask 34. For example, the filler regions 39 may be spin-on glass, polyimide, organic material, screen-printing paste, and the like. A complementary mask 58 is thus obtained, on the insulating layer 33, formed by filler strips 39 and complementary to the probe mask 34.

Next (FIG. 14), the probe mask 34 is removed.

Figure 15:
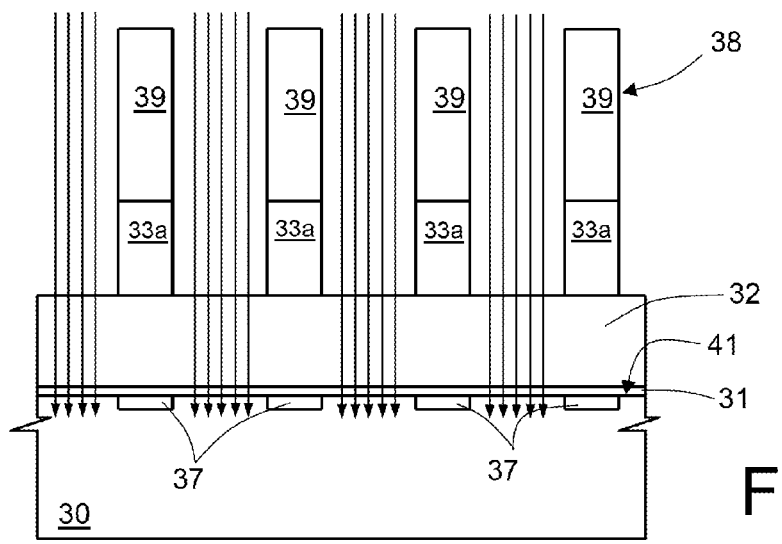

Then, using the complementary mask 58, the insulating layer 33 is etched, for example by a dry etch, leaving insulating portions 33a. The filler regions 39 and the insulating portions 33a form a channel mask 38. Next, a channel P type implantation is performed, for example a boron implantation (FIG. 15). In this way, underneath the areas where the probe mask 34 was previously present, channel regions 40 are formed, which are arranged on the sides of the probe regions 37.

Figure 16:
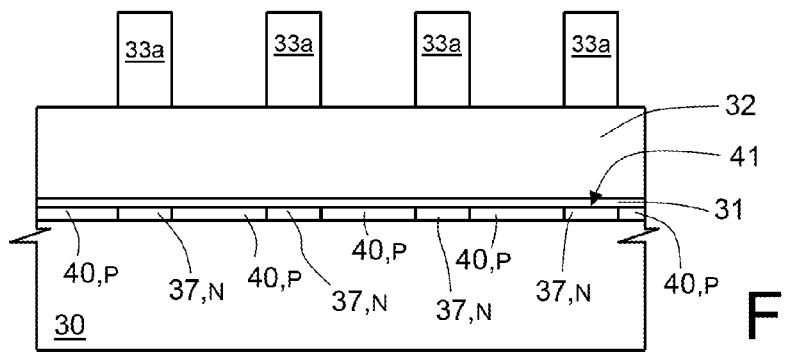
Figure 17:
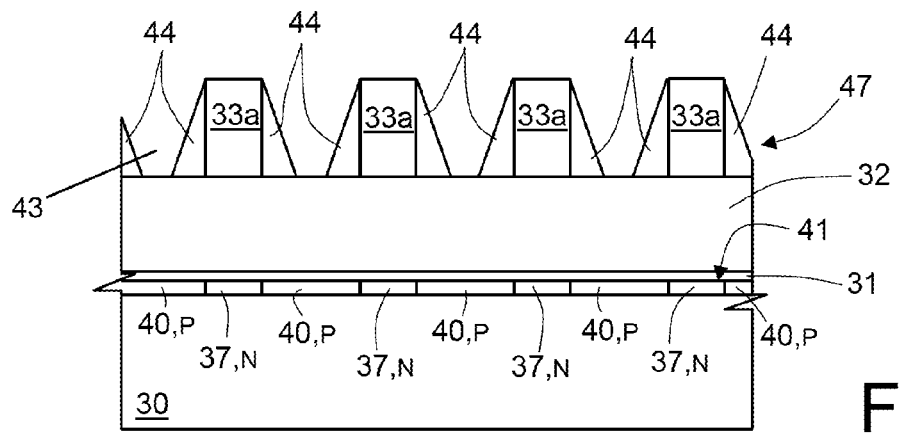
Figure 18:
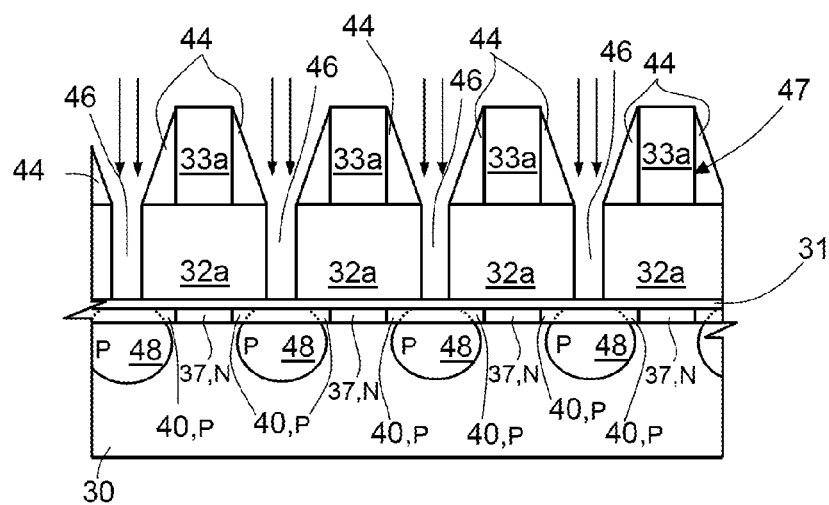
Figure 19:
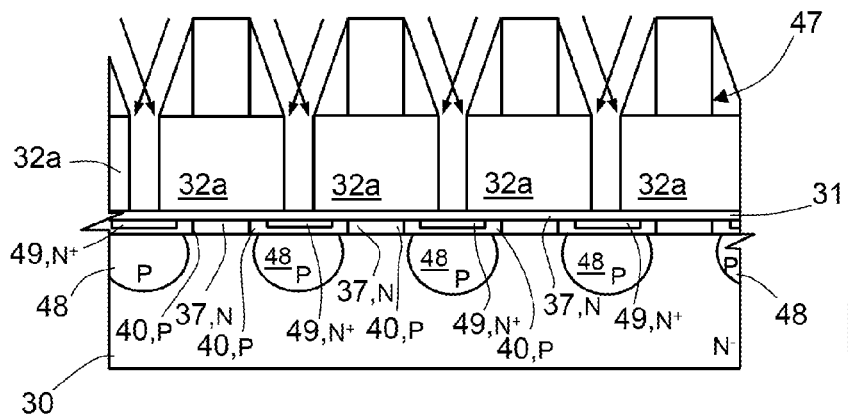
Figure 20:
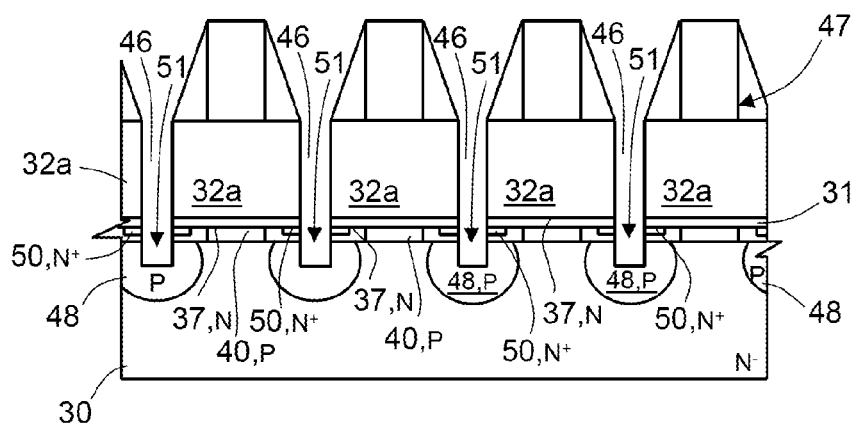
Figure 21:
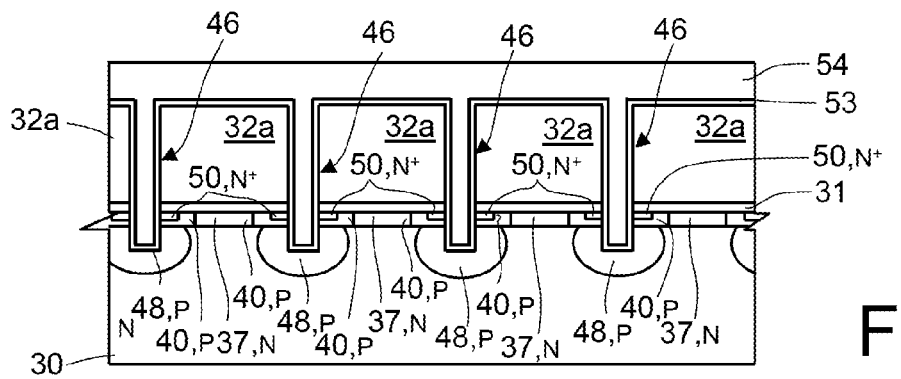
Figure 22:
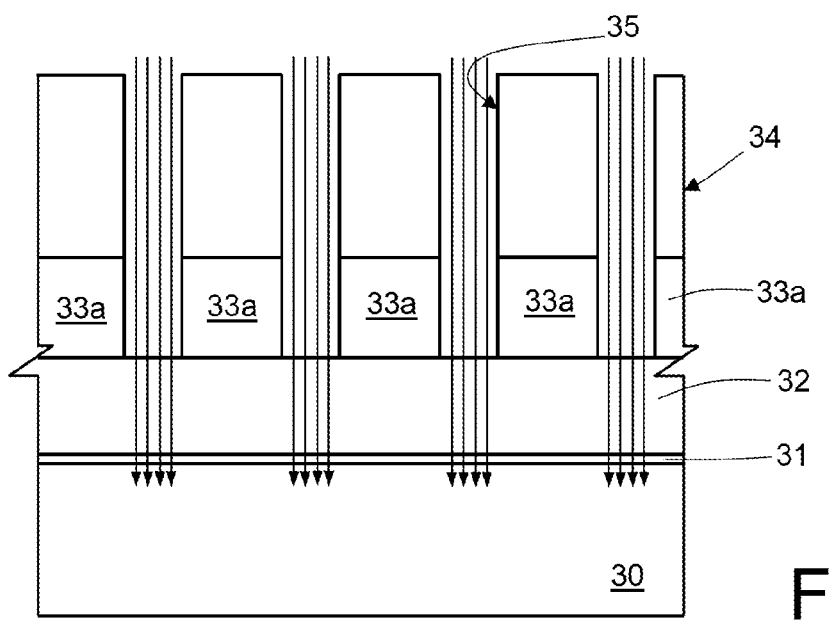
FIGS. 22-28 show cross-sections of a different embodiment of the present AFER diode, in successive manufacturing steps.

Next, the filler regions 39 are removed (complementary mask 58), to obtain the structure of FIG. 16, where the probe regions 37 and the channel regions 40 are arranged in an alternating way in the substrate 30, and the insulating regions 33a extend on the surface 41 of the substrate 30, exactly overlying the probe regions 37 and staggered with respect to the channel regions 40.

As an alternative to the above, it is possible first to remove the complementary mask 58 and then to carry out the channel implantation.

Next (FIG. 17), a spacing layer is deposited, for example an oxide layer such as TEOS, which coats the insulating regions 33a at the top and laterally; followed by an anisotropic etch so as to form spacers 44 on the lateral surfaces of the insulating regions 33a, in a known manner. The insulating regions 33a and the spacers 44 thus form a contact mask 47 having windows 43 where openings are to be formed for the contacts. The contact mask 47 is thus self-aligned to the probe and channel implants and is formed by strips extending perpendicular to the drawing plane and centered with respect to the probe regions 37.

Using the contact mask 47 (FIG. 18), the gate layer 32 is first etched (to form gate regions 32a) and then a well implantation of a P type is performed. Well regions 48 are thus formed in the substrate 30, partially overlying the channel regions 40.

Then (FIG. 19), using the same contact mask 47, a tilted implant with dopant species of an N+ type, for example As, is carried out so as to form enriched regions 49 that extend each, with their own peripheral portions, underneath gate regions 32a.

Next (FIG. 20), the gate oxide layer 31 and the substrate 30 are etched and removed underneath the windows of the contact mask 47 to form microtrenches 51, arranged aligned to, and as a continuation of, the contact openings 46. In this way, also part of the enriched regions 49 is removed to form, underneath the gate regions 32a, source regions 50 of an N+ type.

After removal of the contact mask 47, for example by wet etches (FIG. 21), a silicide layer 53 is deposited, similar to the silicide layer 15 of FIG. 1, as well as a contact region 54, for example of metal and similar to the metal region 14 of FIG. 1. Alternatively, the contact mask 47 may be kept, even though its removal enables a larger surface of the gate regions 32a to be obtained to may be contacted by the contact region 54.

After thermal activation steps of the dopant species, a structure similar to that of FIG. 1 is obtained.

In this way, the photo-technique used for forming the probe mask 34 also determines the shape and arrangement of the subsequent channel mask 38 and contact mask 47, which are thus self-aligned to the probe mask 34, thereby eliminating any criticality existing with the prior art and reducing the costs, thanks to the reduction of the photo-techniques for forming the photoresist masks in the prior-art process.

FIGS. 22-27 show a different embodiment of the present process, wherein same parts of the process of FIGS. 11-21 have been designated by the same reference numbers.

Figure 11:
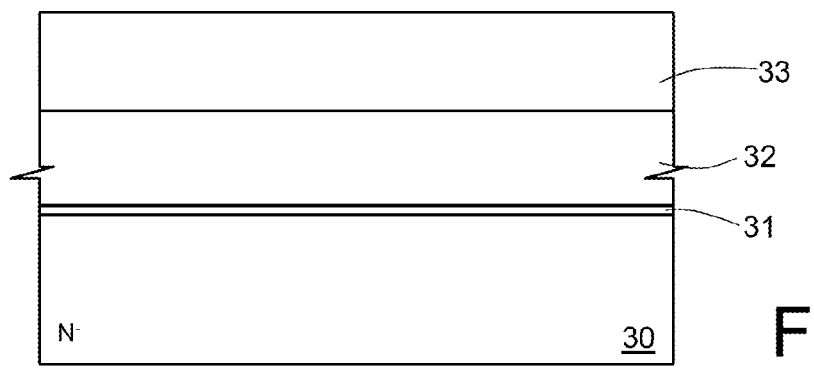
FIGS. 11-21 show cross-sections of an embodiment of the present AFER diode, in successive manufacturing steps.
Figure 23:
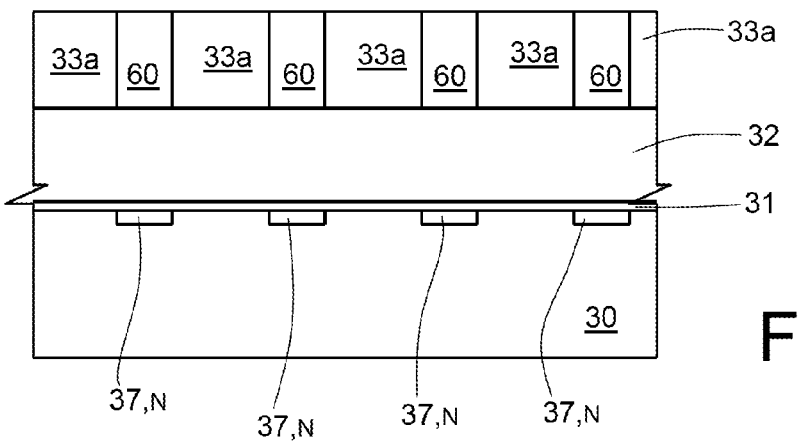
Figure 24:
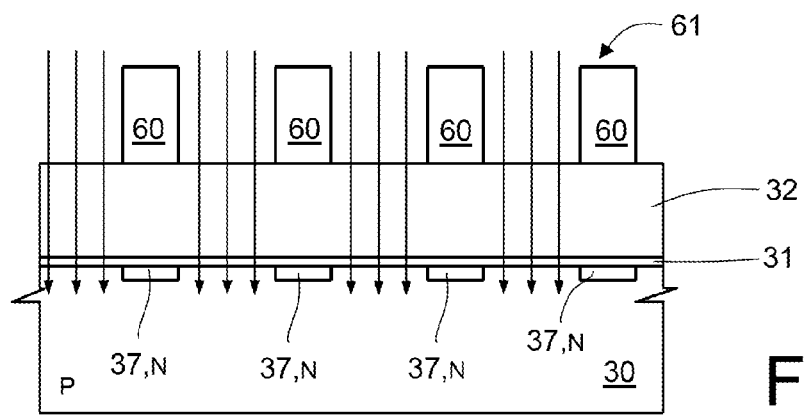

Initially, the same steps described with reference to FIG. 11 are carried out, including: forming edge regions (not shown); and forming the gate oxide layer 31, the gate layer 32, and the insulating layer 33. Then, similarly to what shown in FIG. 12, the photo-technique is used to form the probe mask 34, but in this case, prior to performing the probe implantation, the insulating layer 33 is etched, e.g., by dry etch, leaving the insulating portions 33a. The probe implant (FIG. 22) is then carried out, here only through the gate layer 32 (and the thin gate oxide layer 31) so that the implantation energy is less than the energy in the step of FIG. 12, and leads to formation of the probe regions 37 (FIG. 23).

Next (FIG. 23), the probe mask 34 is removed, and a filling layer 60 is deposited and fills the openings or windows 35 between the insulating portions 33a. The material of the filling layer has high selectivity in regard to the material of the insulating portions 33a. For example, a nitride layer is deposited, the thickness whereof is such as to completely fill the cavities, and thus depends, i.e., upon the width of the openings 35. After a planarization step, for example via etch-back or CMP (Chemical-Mechanical Polishing), which leads to the elimination of the excess part of the nitride layer above the insulating portions 33a, nitride regions 60 are obtained.

Next (FIG. 24), the insulating portions 33a are removed via wet etching. Since the selectivity of the etch may be very high, virtually infinite, the nitride regions 60 are not affected by this etch and define a channel mask 61 complementary to the probe mask 34. Then, using the channel mask 61, the channel implant of a P type is made, for example a boron implant, to form the channel regions 40, also here arranged alongside and alternate with the probe regions 37 (FIG. 25).

Figure 25:
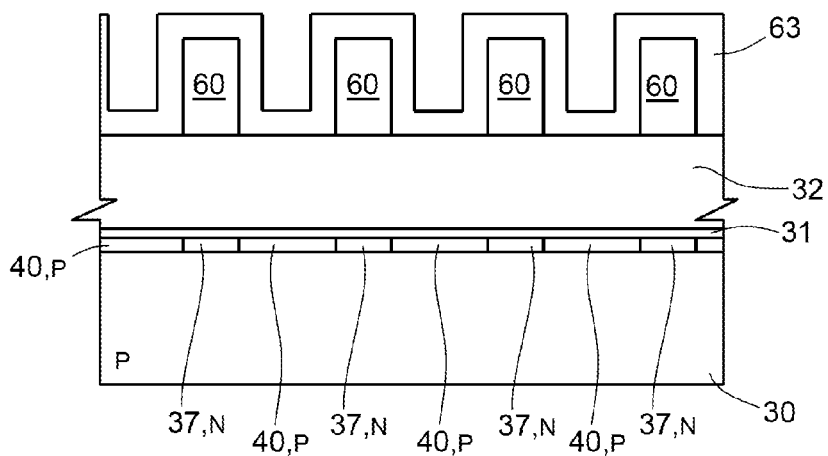
Figure 26:
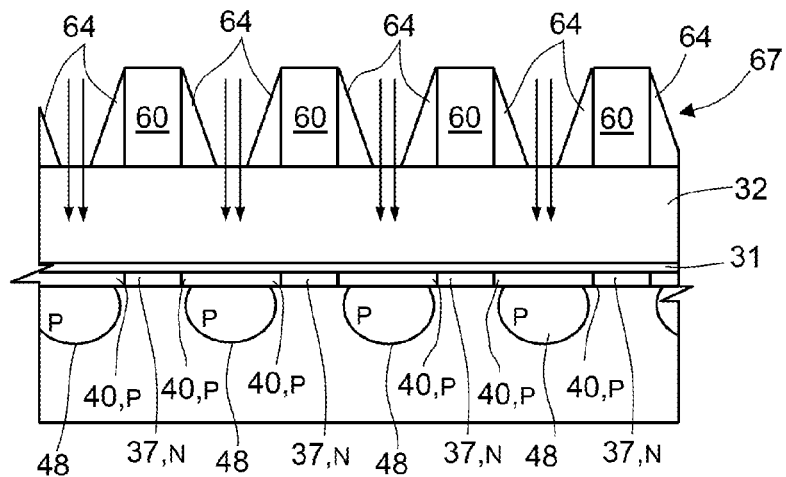
Figure 27:
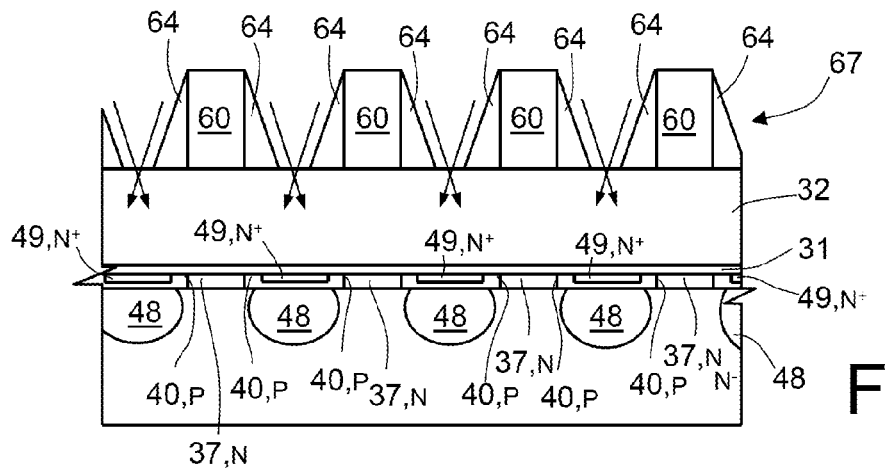

The spacing layer is then deposited, here designated by 63 (FIG. 25). The spacing layer 63 is anisotropically etched and leads to formation of spacers 64 on the lateral surfaces of the nitride regions 60 (FIG. 26). The nitride regions 60 and the spacers 64 thus form a contact mask 67, used for carrying out the well implant, of a P type. Well regions 48 are thus formed in the substrate 30, also here partly overlying the channel regions 40.

Then (FIG. 27), using the same contact mask 67, an N+ type tilted implantation is carried out, for forming the enriched regions 49.

Next (FIG. 28), the gate layer 32, the gate region 32, the gate oxide layer 31, and the substrate 30 are etched and removed where exposed by the contact mask 47, to form N+ type gate regions 32a and source regions 50.

Figure 28:
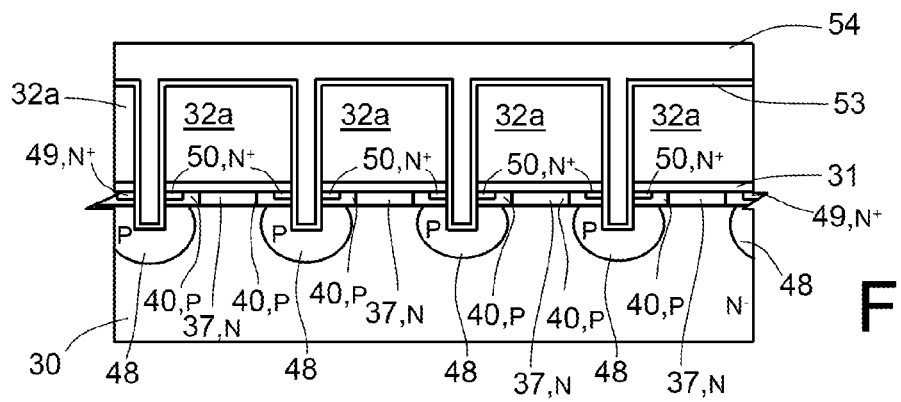

After removing the contact mask 67, the silicide layer 53 and the contact region 54 are deposited to obtain the structure of FIG. 28.

Also in this case, after the thermal steps for activating the dopant species, a structure is obtained similar to that of FIG. 1.

In practice, in this case, the probe mask 61 forms the mask complementary to the probe mask 34 and is arranged laterally and complementarily to the probe mask 34, in a projection on a plane parallel to the surface of the body.

According to a different embodiment, the complementary mask may be obtained using a negative photoresist.

Figure 12:
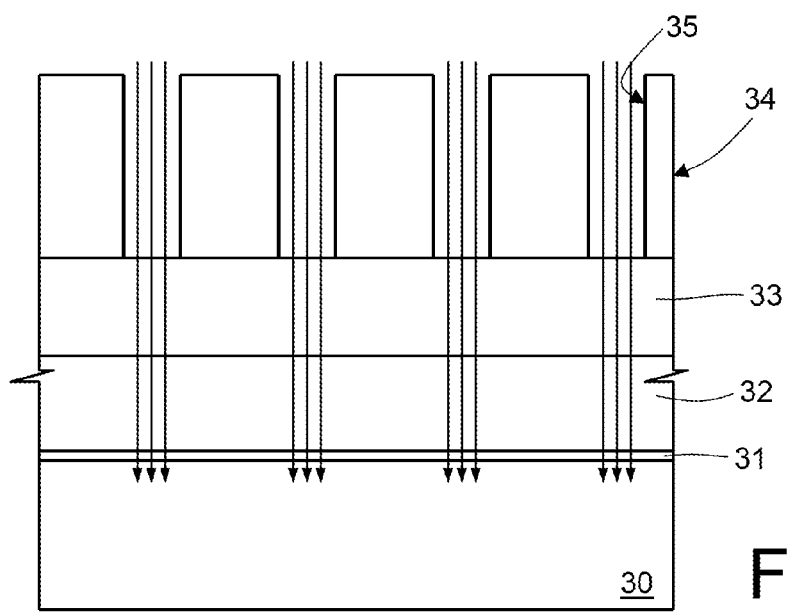
Figure 13:
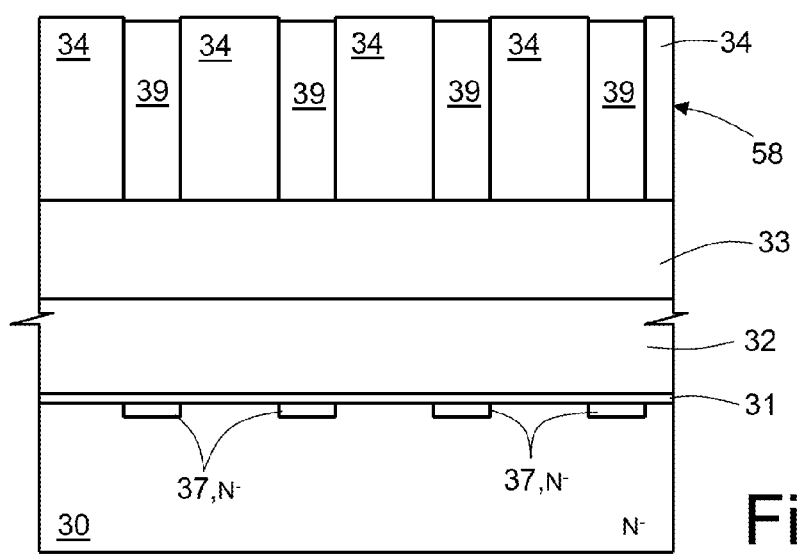
Figure 29:
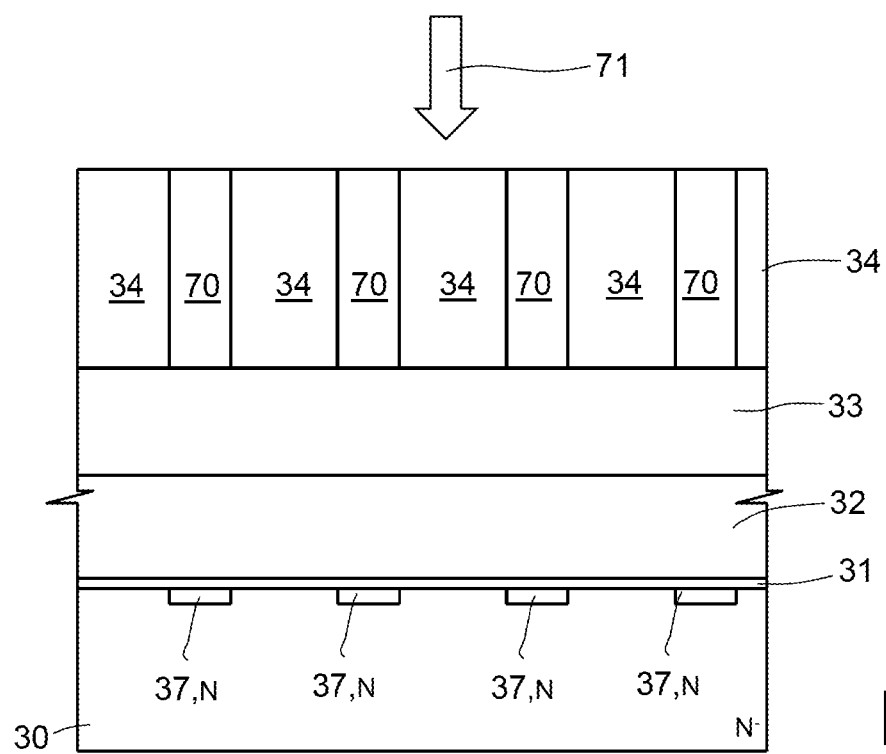
FIGS. 29 and 30 show cross-sections of another different embodiment of the present AFER diode, in an intermediate manufacturing step.

Also in this case, after the initial steps of FIGS. 11-12, including forming the gate oxide layer 31, the gate layer 32, the insulating layer 33, the probe mask 34, and the probe regions 37, the windows 35 of the probe mask 34 are filled with the filling material, here designated by 70 (FIG. 29), by deposition and etch-back until the resist of the probe mask 34 is exposed. In this case, the filling material 70 is resist of a complementary type to the probe mask 34. Typically, if the probe mask 34 is of positive resist, the filling material 70 is of negative resist, sensitive to the same wavelength as the positive resist.

Thus, the structure is completely (blank) photoexposed, without the use of any coating or mask, thus causing development both of the positive-resist regions 34 (previously covered, during formation of the probe mask 34 and thus not previously developed, and now rendered soluble by being developed) and of the negative-resist regions 70 (which undergo cross-linking and thus become insoluble during development), as indicated schematically in the figure by the arrow 71.

Figure 14:
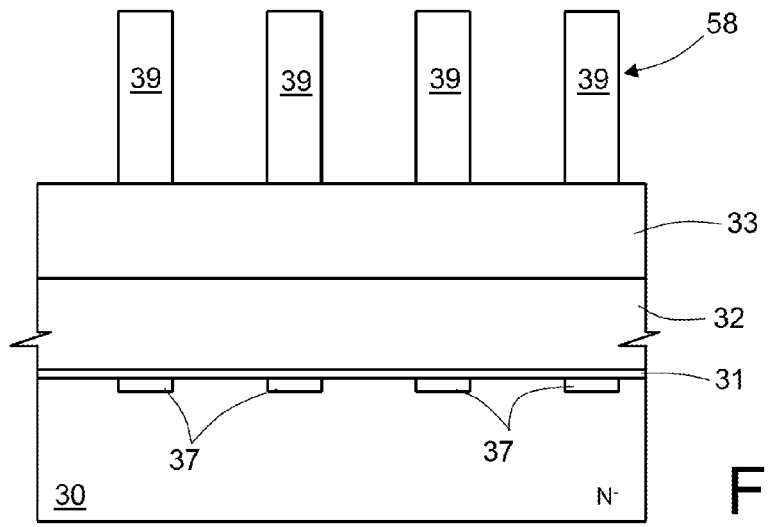
Figure 30:
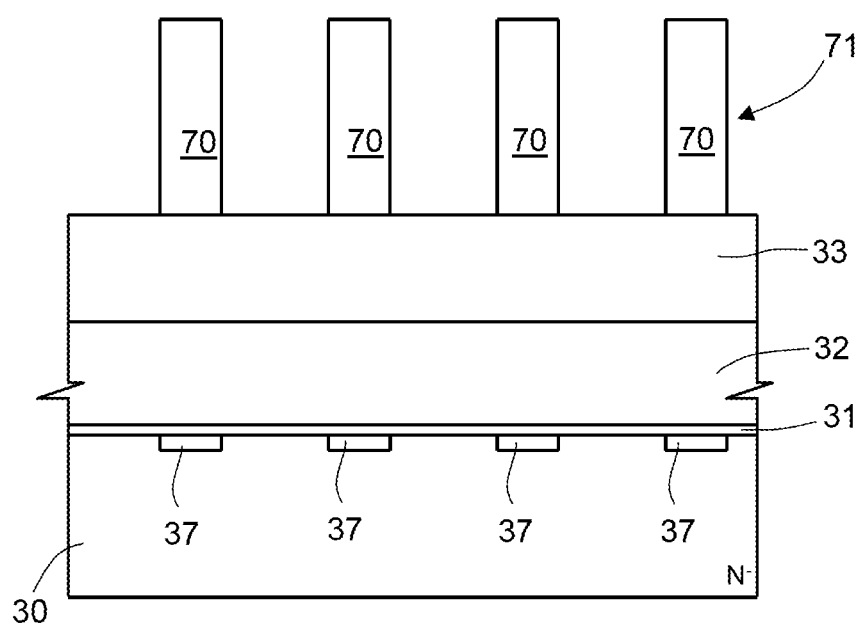

Due to the different properties of the positive and negative resist, the subsequent development leaves the regions formed by the filling material 70 unaltered and causes removal of the probe mask 34, to obtain the structure of FIG. 30, which is structurally the same as FIG. 14, wherein the filler regions 39 are replaced by the negative-resist regions 70 and the complementary mask 58 is replaced by the complementary mask 72.

The process then proceeds in the way described with reference to FIGS. 15-21, including: etching the insulating layer 33, channel implanting, and forming the channel regions 37; removing the channel mask (including the portions 70); forming the spacers 44; etching the gate layer 32, with formation of the gate regions 32a; well implanting, with formation of the well regions 48; source tilted implanting, with formation of the enriched regions 49; etching the substrate 30, with formation of the microtrenches 51 and the source regions 50; and forming the contact region 54.

It should be noted that in all the embodiments, the exact shape and size of the various regions are represented only schematically and may vary with respect to what shown. For example, even though the channel regions 40 and the probe regions 37 are shown with the same depth, in general their depth is different, similarly to what shown in FIG. 1, where the probe region 5 is deeper than the source region 16.

Moreover, in a per se known manner, the depth of the source regions 50, after implantation, may vary with respect to what is illustrated, but, with the subsequent thermal budgets for dopant activation, the deep part of the P-well region 48 diffuses isotropically, joining without interruptions with the channel region. The manufacturing process described above thus solves the problem of the precision and of the associated costs for alignment of the probe, channel, and source regions, since the corresponding masks are obtained complementarily to and/or deriving from the first mask (here, the channel mask).

The process is particularly advantageous, not only because it does not involve the use of the costly solutions that are currently used, but also on account of its simplicity and reduction in the number of photo-technique steps. In particular, the described process becomes particularly important to enable scaling of the technology to obtain cells of smaller dimensions.

Finally, it is clear that modifications and variations may be made to the process described and illustrated herein, without thereby departing from the scope of the present disclosure, as defined in the attached claims.

For example, the same approach may be used for manufacturing semiconductor devices based upon the use of gallium nitride, in particular forming the gate region. In fact, the process enables evaporation of the metal on the gate region without performing etching thereof, thus preventing damage to the GaN surface because of the plasma.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A process for manufacturing a semiconductor device, comprising:
   forming a semiconductor layer on a surface of a semiconductor body;
   forming a first mask on the semiconductor layer;
   forming a first conductive region in the body by introducing a first dopant species into the body using the first mask;
   forming a second mask laterally and complementarily to the first mask, at least in a projection in a plane parallel to the surface of the body;
   forming a second conductive region in the body by introducing a second dopant species into the body using the second mask, in an adjacent and complementary position to the first conductive region;
   forming a third mask aligned to the second mask by forming spacers on sides of the second mask; and
   forming a gate region by removing portions of the semiconductor layer using the third mask.

2. The process according to claim 1 wherein:
   the first mask includes a window;
   forming a complementary mask arranged offset and complementarily with respect to at least one portion of the first mask after introducing the first dopant species by at least partially filling the window with a filling material; the second mask at least partially including the complementary mask or being congruent with respect to the complementary mask; and
   removing the first mask after at least partially filling the window.

3. The process according to claim 2 wherein the first mask is a probe mask;
   the first conductive region is a probe region; the second mask is a channel mask; and the second conductive region is a channel region.

4. The process according to claim 2 wherein the semiconductor device is an adjustable field-effect rectifier diode, the process comprising, after removing portions of the semiconductor layer, and using the third mask:
   forming a well region by introducing third dopant species into the body;
   forming a source region by introducing fourth dopant species into the channel region in a tilted way;
   forming a microtrench by removing a portion of the body; and
   depositing a conductive contacting layer filling the microtrench and extending at least on one side of the gate region and in electrical contact with the gate region, the source region, and the well region.

5. The process according to claim 4 wherein the body, the first conductive region, and the source region have a first conductivity type, and the well region and the second conductive region have a second conductivity type.

6. The process according to claim 4 wherein the semiconductor layer is of polysilicon, and the conductive contacting layer is metal.

7. The process according to claim 2, further comprising forming a masking layer prior to providing the first mask, on the semiconductor layer; and wherein forming the second mask includes removing portions of the masking layer using the complementary mask.

8. The process according to claim 7 wherein introducing first dopant species and filling the first window are performed prior to removing portions of the masking layer; the complementary mask extends over the masking layer, laterally with respect to the first mask; and introducing first dopant species includes implanting the first dopant species through the masking layer.

9. The process according to claim 8, further comprising removing the complementary mask prior to forming spacers.

10. The process according to claim 8 wherein removing the complementary mask is carried out before or after introducing second dopant species.

11. The process according to claim 8 wherein the first mask is of first-type photoresist, and the filling material is a second-type photoresist.

12. The process according to claim 11 wherein the first-type photoresist is positive, and the filling material is negative photoresist and, prior to removing the first mask, the structure is photoexposed blank.

13. The process according to claim 2 wherein providing a first mask includes forming, on the semiconductor layer, a masking layer and first mask regions, and removing portions of the masking layer not covered by the first mask regions; and forming a second mask includes removing the first mask regions, and, after at least partially filling the window with filling material, removing remaining portions of the masking layer.

14. A method, comprising:
    forming a plurality of probe regions in a substrate, the forming of the probe regions including:
        forming a first mask having openings over an insulating layer and a conductive layer;
        implanting a dopant through the openings in the first mask;
        forming a second mask by filling the openings of the first mask;
        removing the first mask;
        forming a third mask by removing portions of the insulating layer using the second mask;
        forming a plurality of channel regions using the third mask, the plurality of probe regions and the plurality of channel regions being self-aligned.

15. The method of claim 14 wherein forming the third mask includes forming a spacer adjacent to sidewalls of the insulating layer.

16. The method of claim 15, further comprising forming a plurality of gate regions by removing portions of the conductive layer with the third mask before forming the plurality of channel regions, the third mask having openings between the gate regions.

17. The method of claim 16 wherein forming the plurality of channel regions includes implanting a dopant through the openings in the third mask.

18. The method of claim 17, further comprising removing the third mask and forming a contact in the openings between the gate regions.

* * * * *